United States Patent
Toshiyoshi et al.

(10) Patent No.: US 11,489,460 B2
(45) Date of Patent: Nov. 1, 2022

(54) VIBRATION-DRIVEN ENERGY HARVESTER

(71) Applicants: The University of Tokyo, Tokyo (JP); SAGINOMIYA SEISAKUSHO, INC., Tokyo (JP)

(72) Inventors: Hiroshi Toshiyoshi, Tokyo (JP); Hisayuki Ashizawa, Sayama (JP); Masahiro Morita, Sayama (JP)

(73) Assignees: The University of Tokyo, Tokyo (JP); Saginomiya Seisakusho, Inc., Tokyo (JP)

( * ) Notice: Subject to any disclaimer, the term of this patent is extended or adjusted under 35 U.S.C. 154(b) by 82 days.

(21) Appl. No.: 17/053,609

(22) PCT Filed: Apr. 25, 2019

(86) PCT No.: PCT/JP2019/017653
§ 371 (c)(1),
(2) Date: Nov. 6, 2020

(87) PCT Pub. No.: WO2019/216237
PCT Pub. Date: Nov. 14, 2019

(65) Prior Publication Data
US 2021/0234479 A1 Jul. 29, 2021

(30) Foreign Application Priority Data
May 8, 2018 (JP) .............................. JP2018-090197

(51) Int. Cl.
*H02N 1/08* (2006.01)
*B81B 3/00* (2006.01)

(52) U.S. Cl.
CPC ..................................... *H02N 1/08* (2013.01)

(58) Field of Classification Search
CPC .... H02N 1/00; H02N 1/08; B81B 3/00; H02J 50/001
(Continued)

(56) References Cited

U.S. PATENT DOCUMENTS

| | | | |
|---|---|---|---|
| 5,801,475 A | 9/1998 | Kimura | |
| 6,833,687 B2 * | 12/2004 | Landolt | H02N 1/00 320/166 |

(Continued)

FOREIGN PATENT DOCUMENTS

| | | |
|---|---|---|
| JP | 7-107752 A | 4/1995 |
| JP | 2013-172523 A | 9/2013 |

(Continued)

OTHER PUBLICATIONS

H. Toshiyoshi, "MEMS Vibrational Energy Harvester for IoT Wireless Sensors," 2020 IEEE International Electron Devices Meeting (IEDM), 2020, pp. 37.3.1-37.3.4, doi: 10.1109/IEDM13553.2020.9372002. (Year: 2020).*

(Continued)

*Primary Examiner* — Burton S Mullins
(74) *Attorney, Agent, or Firm* — Crowell & Moring LLP

(57) ABSTRACT

The vibration-driven energy harvester includes: a first electrode; a second electrode facing the first electrode; a holder holding the first electrode and the second electrode so as to be movable relative to each other; a half-wave rectifier electrically connected to the first and the second electrodes that causes current flowing from the first electrode to the second electrode to flow to an output unit, and cuts off current flowing from the second electrode toward the first electrode; and a second rectifying element electrically connected to the first and the second electrodes that allows the current flowing from the second electrode to the first electrode and blocks the current flowing from the first electrode to the second electrode, wherein: the first electrode has a positively charged electret in a surface facing the second electrode, or the second electrode has a negatively charged electret in a surface facing the first electrode.

8 Claims, 6 Drawing Sheets

(58) Field of Classification Search
USPC .................. 310/309; 318/116; 322/2 A, 2 R
See application file for complete search history.

(56) References Cited

U.S. PATENT DOCUMENTS

| | | | | |
|---|---|---|---|---|
| 7,804,205 | B2* | 9/2010 | Murayama | H01G 5/16 |
| | | | | 307/400 |
| 7,965,016 | B2* | 6/2011 | Despesse | H02N 2/186 |
| | | | | 310/309 |
| 8,018,119 | B2* | 9/2011 | Matsubara | H02N 1/08 |
| | | | | 310/309 |
| 8,710,712 | B2* | 4/2014 | Nakatsuka | H02N 1/10 |
| | | | | 318/116 |
| 10,734,922 | B2* | 8/2020 | Okada | H02N 1/10 |
| 2014/0056043 | A1 | 2/2014 | Naito et al. | |
| 2014/0065751 | A1 | 3/2014 | Suzuki et al. | |

FOREIGN PATENT DOCUMENTS

| | | |
|---|---|---|
| JP | 2014-49557 A | 3/2014 |
| WO | WO 2013/136691 A1 | 9/2013 |

OTHER PUBLICATIONS

Y. Liu, et al. "Dual-Stage-Electrode-Enhanced Efficient SSHI for Rotational Electret Energy Harvester," 2019 20th International Conf. on Solid-State Sensors, Actuators and Microsystems & Eurosensors XXXIII (Transducers & Eurosensors XXXIII), 2019, pp. 1471-1474.doi: 10.1109/TRANSDUCERS.2019.8808201. (Year: 2019).*

B. D. Truong, et al. "Analysis of Power Electronic Interface for Capacitive MEMS Energy Harvesters," 2017 New Generation of CAS (NGCAS), 2017, pp. 173-176, doi: 10.1109/NGCAS.2017.37. (Year: 2017).*

International Search Report (PCT/ISA/210) issued in PCT Application No. PCT/JP2019/017653 dated Jul. 30, 2019 with English translation (two (2) pages).

Japanese-language Written Opinion (PCT/ISA/237) issued in PCT Application No. PCT/JP2019/017653 dated Jul. 30, 2019 (four (4) pages).

* cited by examiner (a)

(b)

(c)

(a)

(b)

PRIOR ART

VIBRATION-DRIVEN ENERGY HARVESTER

TECHNICAL FIELD

The present invention relates to a vibration-driven energy harvester.

BACKGROUND ART

As one of energy harvesting technologies for harvesting energy from environmental vibration, there is known an approach of generating electric power from environmental vibration using a vibration-driven energy harvesting element which is a MEMS (Micro Electro Mechanical Systems) vibration element. The vibration-driven energy harvesting element itself includes a piezoelectric element or a capacitance-type element. When the element is vibrated at a frequency of environmental vibration, the element generates an alternating current power having the same frequency. Thus, there has been proposed a vibration-driven energy harvester that combines a vibration-driven energy harvesting element and a power supply circuit that converts alternating current power generated by the vibration-driven energy harvesting element into direct current or alternating current suitable for use (see PTL1, for example). In PTL1, a general two-phase full-wave rectifying circuit is used as a rectifying circuit for rectifying alternating current power generated by a capacitance-type vibration-driven energy harvesting element (i.e., for converting alternating current to direct current).

CITATION LIST

Patent Literature

PTL1: Japanese Laid-Open Patent Publication No. 2013-172523

SUMMARY OF INVENTION

Technical Problem

Since vibration energy of environmental vibration is weak, a vibration-driven energy harvester that converts environmental vibration into electric energy with a high efficiency is required.

Solution to Problem

A vibration-driven energy harvester according to the 1st aspect comprises: a first electrode; a second electrode that faces the first electrode; a holder that holds at least one of the first electrode and the second electrode so that the first electrode and the second electrode move relative to each other; a half-wave rectifier that includes a first rectifying element and an output unit and is electrically connected to the first electrode and the second electrode so that the half-wave rectifier allows a current flowing from the first electrode toward the second electrode to flow into the output unit and blocks a current flowing from the second electrode toward the first electrode; and a second rectifying element that is electrically connected to the first electrode and the second electrode so that the second rectifying element allows a current flowing from the second electrode toward the first electrode to flow therethrough and blocks a current flowing from the first electrode toward the second electrode, wherein: the first electrode has a positively charged electret in a surface on a side facing the second electrode, or the second electrode has a negatively charged electret in a surface on a side facing the first electrode.

The vibration-driven energy harvester according to the 2nd aspect is in the vibration-driven energy harvester according to the 1st aspect, it is preferable that the vibration-driven energy harvester include two first electrodes, two second electrodes, two first rectifying elements, and two second rectifying elements; either one of the two first electrodes or the two second electrodes are electrically connected to each other and to one end of each of the two second rectifying elements; and another of the two first electrodes or the two second electrodes, which is different from the one, are electrically connected to another end of each of the two second rectifying elements, which is different from the one end, and to one end of each of the two first rectifying element.

The vibration-driven energy harvester according to the 3rd aspect is in the vibration-driven energy harvester according to the 2nd aspect, it is preferable that the holder includes: a first holding portion that integrally holds the two first electrodes; a second holding portion that integrally holds the two second electrodes; and a relative moving portion that allows the two first electrodes and the two second electrodes to move relative to each other.

The vibration-driven energy harvester according to the 4th aspect is in the vibration-driven energy harvester according to any one of the 1st aspect to the 3rd aspect, it is preferable that the output unit includes a capacitor and a voltage conversion circuit arranged in parallel with the capacitor.

The vibration-driven energy harvester according to the 5th aspect is in the vibration-driven energy harvester according to any one of the 1st aspect to the 4th aspect, it is preferable that at least one of the first rectifying element and the second rectifying element is a diode.

Advantageous Effects of Invention

According to the present invention, energy of environmental vibration can be converted into electric energy with a high efficiency.

DESCRIPTION OF EMBODIMENTS

First Embodiment

Figure 1:
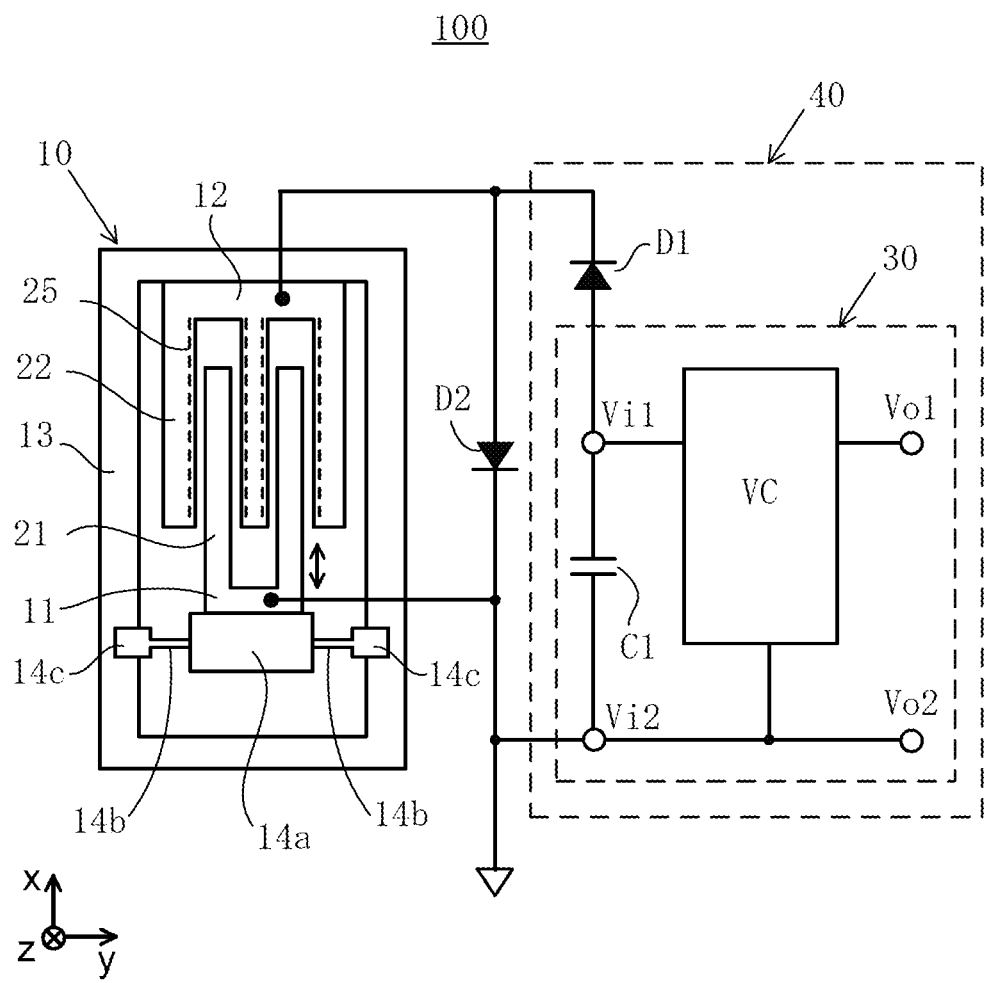
FIG. 1 is a schematic view showing a schematic configuration of a vibration-driven energy harvester 100 of a first embodiment according to the present invention.

Now, a first embodiment of the present invention will be described with reference to the drawings. FIG. 1 is a schematic view showing a schematic configuration of a vibration-driven energy harvester of the first embodiment according to the present invention. The vibration-driven energy harvester 100 includes a vibration-driven energy harvesting element 10 that generates alternating current power due to environmental vibration, and a half-wave rectifier 40 that extracts the generated alternating current power as a power source.

The vibration-driven energy harvesting element 10, which is of capacitance type, has a first electrode 11 which is a movable electrode as one example and a second electrode 12 which is a fixed electrode as one example. The first electrode 11 is a comb electrode having two comb portions 21 as one example, and the second electrode 12 is a comb electrode having three comb portions 22 as one example.

The comb portions 21 of the first electrode 11 and the comb portions 22 of the second electrode 12 have a predetermined thickness in the Z direction in the figure.

The first electrode 11 and the second electrode 12 face each other in portions where they mesh with each other. The first electrode 11 and the second electrode 12 can be manufactured, for example, as a MEMS structure with silicon as a base material.

In the comb portions 22 of the second electrode 12, surface regions 25 on sides facing the comb portions 21 of the first electrode 11 have electrets having negative charges formed by being subjected to a known charging process (for example, a charging process described in Japanese Laid-Open Patent No. 2014-049557).

Due to the electretization, the comb portions 22 of the second electrode 12 are semi-permanently charged. As a result, in the comb portions 21 of the first electrode 11 facing the electretized electrode, induced charges having characteristics opposite to those of the charges of the electretized electrode, that is, positive induced charges are induced.

Note that in a case where the surface of the fixed electrode or the movable electrode is not silicon, it is preferable to deposit polycrystalline silicon or amorphous silicon on the surface before being subjected to the charging process.

The second electrode 12 is fixedly held by an insulating support frame 13.

On the other hand, the first electrode 11 is held by a holder 14 (an electrode holding portion 14a, connecting portions 14b, fixing portions 14c) to vibrate with respect to the support frame 13 in the vertical direction (X direction) in the figure. The holder 14 includes the electrode holding portion 14a that holds the first electrode 11, the fixing portions 14c that are fixed to the support frame 13, and the flexible connecting portions 14b that connect the electrode holding portion 14a to the fixing portions 14c.

The connecting portion 14b is a thin piece made of a flexible material such as metal, having a small thickness in the X direction and a large thickness in the Z direction in FIG. 1. When vibration is applied to the support frame 13 from outside, the two connecting portions 14b provided on the left and right of the electrode holding portion 14a in the figure are bent, so that the electrode holding portion 14a vibrates in the X direction with respect to the support frame 13. As a result, the first electrode 11 held by the electrode holding portion 14a vibrates in the X direction with respect to the second electrode 12 fixed to the support frame 13.

The vibration between the first electrode 11 and the second electrode 12 in the X direction increases or decreases areas of surfaces where the comb portions 21 of the first electrode 11 and the comb portions 22 of the second electrode 12 face each other. This results in a change in areas of the facing portions between the first electrode 11 and the second electrode 12, a change in electric charges induced by the electrets, and a change in a potential difference between the first electrode 11 and the second electrode 12 to generate an electromotive force. Thus, an electric power is generated by the vibration-driven energy harvesting element 10.

In this description, joining one electric element and another electric element in an electrically conductive manner by a wire made of a conductor including metal or semiconductor is referred to as "electrically connecting".

As will be described later, the vibration-driven energy harvesting element 10 converts energy of vibration in an environment where the vibration-driven energy harvester 100 is installed into electric energy to generate an alternating current power.

A cathode of a diode D1 which is a first rectifying element and an anode of a diode D2 which is a second rectifying element are electrically connected to the second electrode 12. On the other hand, a cathode of the diode D2 is electrically connected to the first electrode 11.

Further, one terminal Vi1 on an input side of an output unit 30 including a capacitor C1 and a voltage converter VC is electrically connected to an anode of the diode D1 which is the first rectifying element, and the other terminal Vi2 on the input side of the output unit 30 is electrically connected to the cathode of the diode D2 and the first electrode 11. A potential of the first electrode 11 is a ground potential.

In this way, for an alternating current power generated by the vibration-driven energy harvesting element 10 in a case where the first electrode 11 has a positive potential and the second electrode 12 has a negative potential, the diode D1 is forward-biased so that a current flowing from the first electrode 11 to the second electrode 12 passes through the diode D1 and charges the capacitor C1. A charging voltage between the input terminals Vi1 and Vi2 of the output unit 30 is converted by the voltage converter VC and is output from one terminal Vo1 on an output side of the output unit 30 and the other terminal Vo2 on the output side to an external electronic device or a charging device.

For example, a chopper-type DC-DC converter may be used as the voltage converter VC.

In the case where the first electrode 11 has a positive potential and the second electrode 12 has a negative potential, the diode D2 is reverse-biased so that no current flows through the diode D2 to the second electrode 12. That is, the current from the first electrode 11 to the second electrode 12 is blocked by the diode D2.

On the other hand, for an alternating current power generated by the vibration-driven energy harvesting element 10 in a case where the first electrode 11 has a negative potential and the second electrode 12 has a positive potential, the diode D2 is forward-biased so that a current flows from the second electrode 12 to the first electrode 11. Since this current direction is a forward current direction for the diode D2, an electric resistance of the diode D2 becomes almost zero. In the case where the first electrode 11 has a negative potential and the second electrode 12 has a positive potential, the diode D1 is reverse-biased so that no current flows to the output unit 30. The diode D1 and the output unit 30 constitute a half-wave rectifier 40.

That is, the first embodiment is characterized in that, for the alternating current power generated by the vibration-driven energy harvesting element 10, only the current flowing from the first electrode 11 toward the second electrode 12 is extracted from the output unit 30 and the current flowing in a direction from the second electrode 12 toward the first electrode 11 is allowed to flow from the second electrode 12 to the first electrode 11 through the diode D2, which is a rectifying element, with almost no resistance (no load).

With this configuration, the vibration-driven energy harvester 100 of the first embodiment can prevent an electric field between the first electrode 11 and the second electrode 12 from being weakened according to a principle described below in a vibration state in which the electretized second electrode 12 has a negative potential and the first electrode 11 has a positive potential. Thus, energy of environmental vibration can be converted into electric energy with an efficiency higher than that in a conventional vibration-driven energy harvester.

Figure 2:
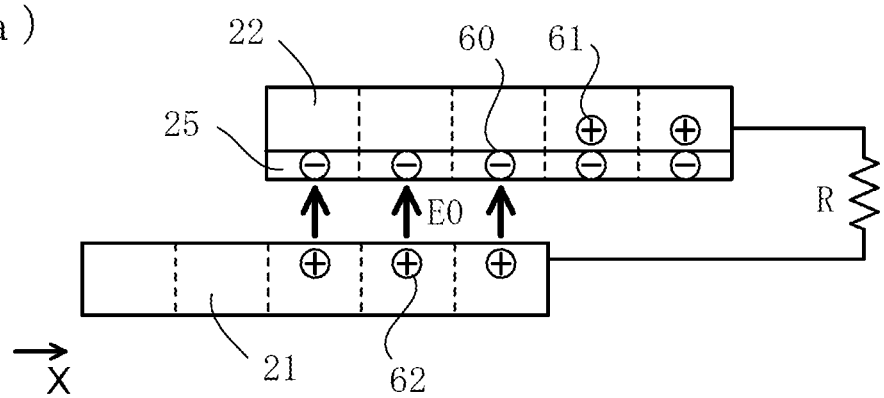
FIG. 2 is a view schematically illustrating an operational principle of the vibration-driven energy harvester of the first embodiment.
Figure 2:
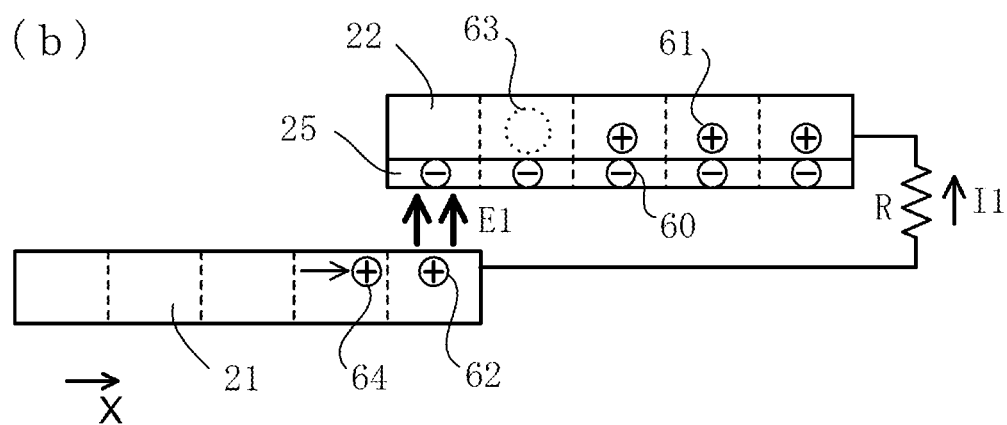
Figure 2:
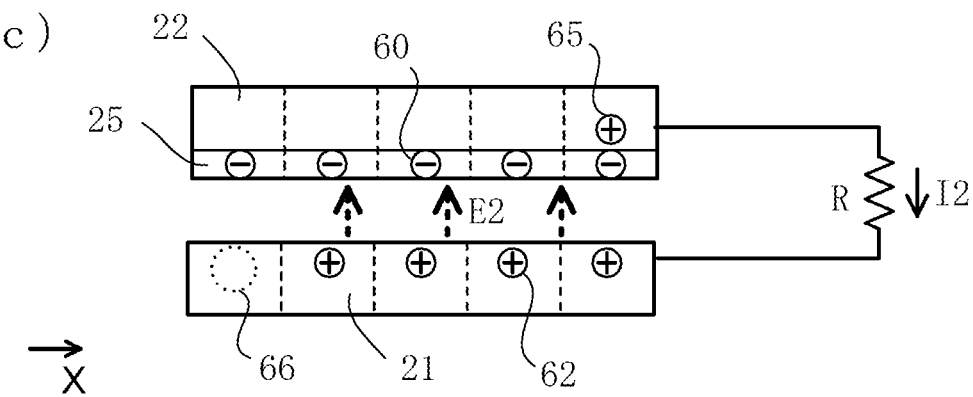

FIG. 2 is a view schematically showing an operational principle of the vibration-driven energy harvesting element 10.

Now, the reason why the energy conversion efficiency of the vibration-driven energy harvester 100 of the first embodiment is high will be described with reference to FIG. 2. FIG. 2(a) to (c) are views showing how the comb portions 21 of the first electrode 11 and the comb portions 22 of the second electrode 12 shown in FIG. 1 relatively move in the X direction in FIG. 1. In the description of FIG. 2, for simplification, the comb portions 21 of the first electrode 11 are referred to as a first electrode 21 and the comb portions 22 of the second electrode 12 are referred to as a second electrode 22.

FIG. 2(a) is a view showing a state in which the first electrode 21 and the second electrode 22 face each other in their predetermined portions. In a surface region 25 of the second electrode 22 facing the first electrode 21, an electret charged with negative charges 60 is formed.

The negative charges 60 induce positive charges 62 in a surface of the first electrode 21 facing the second electrode 22. On the other hand, in a portion of the second electrode 22 that does not face the first electrode 21, the negative charges 60 in the region 25 induce positive charges 61 inside the second electrode 22.

The positive charges 62 induced in the first electrode 21 and the negative charges 60 due to the electret in the surface of the second electrode 22 generate an electric field E0 in the facing portion between the first electrode 21 and the second electrode 22.

A resistor R in FIG. 2(a) represents a power supply circuit and a load to which the vibration-driven energy harvesting element 10 is connected, in a form of resistance. When the vibration-driven energy harvesting element 10 vibrates in the electric field E0, a voltage generated with a change in an electrostatic capacitance between the first electrode and the second electrode is applied to the resistor R. In examples shown in FIGS. 2(b), (c), an output voltage of the vibration-driven energy harvesting element 10 increases or decreases with vibration between the first electrode 21 and the second electrode 22, as compared with the example shown in FIG. 2(a).

FIG. 2(b) shows a case where the first electrode 21 and the second electrode 22 relatively move in the X direction from the state shown in FIG. 2(a). Here, the area of the facing portion between the first electrode 21 and the second electrode 22 becomes smaller than that in the state shown in FIG. 2(a).

In the state shown in FIG. 2(b), the positive charges 62 in the surface of the first electrode 21 that has been induced by the negative charges 60 in the surface of the second electrode 22 decreases, and the positive charges 61 in the second electrode 22 that has been induced by the negative charges 60 increases, as compared with the state shown in FIG. 2(a).

Therefore, when the state of FIG. 2(a) is changed to the state of FIG. 2(b) due to the vibration between the electrodes, some of the positive charges 62 induced in the first electrode 21 in FIG. 2(a) try to move from the first electrode 21 to the second electrode 22 via the resistor R as a current I1 (precisely, electrons try to move from the second electrode 22 to the first electrode 21). Therefore, the first electrode 21 has a positive potential with respect to the second electrode 22.

However, because this movement of the charges is hindered by the electric resistance of the resistor R, residual positive charges 64 remain in the first electrode 21 while a positive charge deficient portion 63 is generated in a part of the portion of the second electrode 22 facing the negative charges 60. The positive residual charge 64 and the positive charge deficient portion 63 strengthen an electric field E1 in the facing portion between the first electrode 21 and the second electrode 22 as compared with an electric field E0 in the case of FIG. 2(a).

FIG. 2(c) shows a case where the first electrode 21 and the second electrode 22 relatively move in the X direction from the state shown in FIG. 2(a). Here, the area of the facing portion between the first electrode 21 and the second electrode 22 becomes larger than that in the state shown in FIG. 2(a).

In the state shown in FIG. 2(c), the positive charges 62 in the surface of the first electrode 21 that has been induced by the negative charges 60 increase, and the positive charges 61 in the second electrode 22 that has been induced by the negative charges 60 decreases, as compared with the state shown in FIG. 2(a).

Therefore, when the state of FIG. 2(a) is changed to the state of FIG. 2(c) due to the vibration between the electrodes, some of the positive charges 61 induced in the second electrode 22 in FIG. 2(a) try to move from the second electrode 22 to the first electrode 21 via the resistor R as a current I2 (precisely, electrons try to move from the first electrode 21 to the second electrode 22). Therefore, the first electrode 21 has a negative potential with respect to the second electrode 22.

However, because this movement of the charges is hindered by the electric resistance of the resistor R, residual positive charges 65 remain in the second electrode 22 while a positive charge deficient portion 66 is generated in a part of the portion in the first electrode 21 facing the negative charges 60. The positive residual charge 65 and the positive charge deficient portion 66 weaken an electric field E2 at the facing portion between the first electrode 21 and the second electrode 22 as compared with an electric field E0 in the case of FIG. 2(a).

With this weakened electric field E2, the power generation efficiency of the vibration-driven energy harvesting element 10 decreases. Therefore, when an electric power is extracted from the vibration-driven energy harvesting element 10 with the electric field E2 weakened, electrical damping is reduced to slow a conversion speed from mechanical energy to electrical energy. The environmental vibration energy (kinetic energy) stored in the second electrode 22 which is the movable electrode is not effectively converted into electric energy, but rather is wasted.

In the first embodiment, the current flows in the forward direction for the diode D2 which is the second rectifying element when the first electrode 11 has a negative potential with respect to the second electrode 12, as shown in FIG. 1. Because a forward resistance of the diode D2 is much smaller than a reverse resistance, a circuit loss is also small when the current flows from the second electrode 12 to the first electrode 11. As a result, in the circuit of the embodiment including the diode D2 shown in FIG. 2, an electric field E2d generated when the first electrode 21 and the second electrode 22 relatively move as shown in FIGS. 2(a) to 2(c) is larger than the electric field E2 in the circuit illustrated in FIG. 2(c).

It seems that the electric energy generated by the current flowing from the second electrode 12 to the first electrode 21 through the diode D2 would be wasted. However, the electric resistance of the diode D2 against the forward current is substantially zero, and the total amount of the flowing current corresponds to the amount of charges induced in the first electrode 11 and the second electrode 12 and thus has a predetermined upper limit. Therefore, the amount of lost electrical energy ΔEG2, that is, the amount of (resistance)×(current)×(current) is also small.

Figure 3:
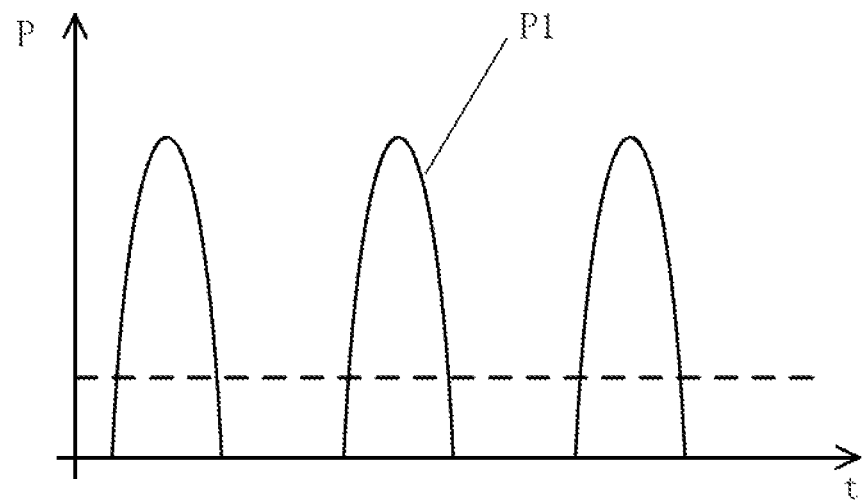
FIG. 3(a) is a graph showing a relationship between power generation output and time for the vibration-driven energy harvester of the first embodiment.
FIG. 3(b) is a graph showing a relationship between power generation output and time for a conventional vibration-driven energy harvester.
Figure 3:
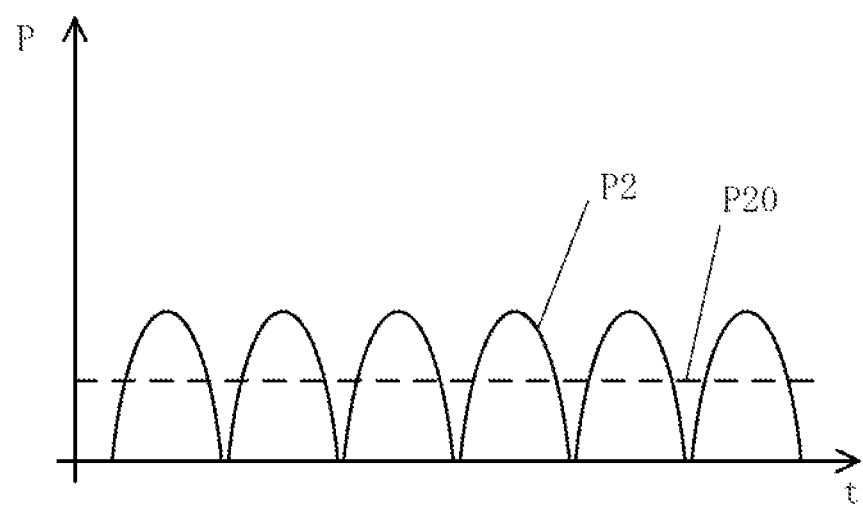

FIG. 3 is a diagram that compares an output of the vibration-driven energy harvester 100 of the first embodiment with an output of a vibration-driven energy harvester using a conventional full-wave rectifying element.

FIG. 3(a) is a diagram showing a relationship between power generation output (power) P1 and time t (horizontal axis) for the vibration-driven energy harvester 100 of the first embodiment, and FIG. 3(b) is a diagram showing a relationship between power generation output (power) P1 and time t (horizontal axis) for a vibration-driven energy harvester using a conventional full-wave rectifying element. The vertical axis in both figures represents output power P.

When a conventional full-wave rectifying element of diode-bridge type is used, for example, for a sinusoidal power (voltage) induced between the first electrode and the second electrode of the vibration-driven energy harvesting element with relative vibration between the electrodes, a negative voltage is inverted into positive by the full-wave rectifying element to output a power P2 approximately equal to an absolute value of the sinusoidal wave. An interval between adjacent peaks in time profile of the electric power P2 is half a period of vibration of the vibration power generation element.

On the other hand, for an output P1 of the vibration-driven energy harvester 100 of the first embodiment shown in FIG. 3(a), a sinusoidal power (voltage) induced between the first electrode 11 and the second electrode 12 is output only in a state where the first electrode 11 is induced into a positive potential and the second electrode 12 is induced into a negative potential. That is, only positive (or negative) parts of the sinusoidal power (voltage) are output. Thus, the number of peaks is half that of the output P2 in the case using the conventional full-wave rectifying element.

However, in the case of the vibration power generation element, energy of vibration applied from outside is equal to the sum of mechanical energy lost as air resistance or friction and electric energy generated by the vibration-driven energy harvesting element. Therefore, if the energy of vibration applied from outside and the lost mechanical energy are constant, a total amount of electric energy that can be extracted is constant, independent of the number of times (frequency) that electric energy is extracted. Therefore, in the output P1 of the vibration-driven energy harvester 100 of the first embodiment, a magnitude (power) of each peak is larger than that of the conventional output P2. Further, without taking the weakening of the electric field E2 described above into consideration, time average P10 of the output power of the vibration-driven energy harvester 100 of the first embodiment is equal to time average P20 of the output power of the device using the conventional full-wave rectifying element.

When taking the weakening of the electric field E2 described above into consideration, the weakening of the electric field E2 is unavoidable in the device using the conventional full-wave rectifying element, so that the power generation efficiency is reduced. Therefore, the time average P10 of the output power of the vibration-driven energy harvester 100 of the first embodiment will be larger than the time average of the device using the conventional full-wave rectifying element.

As described above, in the power generation circuit provided with the diode D2, the electric field in the facing portion between the first electrode 11 and the second electrode 12 becomes E2d that is higher than the electric field E2 shown in FIG. 2(c), for example. The high electric field E2d leads to an increase in electrical damping. The increase in electrical damping reduces an influence of loss in mechanical damping, so that the power generation efficiency of the vibration-driven energy harvesting element 10 can be improved.

Therefore, in the vibration-driven energy harvester 100 of the first embodiment, energy of environmental vibration can be converted into electric energy with an efficiency higher than that of the conventional device.

In the first embodiment described above, the first electrode 11 is the movable electrode and the second electrode 12 is the fixed electrode. However, the configuration is not limited thereto. That is, the first electrode 11 may be a fixed electrode and the second electrode 12 may be a movable electrode.

Further, in the half-wave rectifier 40, the diode D1 is arranged on the second electrode 12 side and the output unit 30 is arranged on the first electrode 11 side. However, inversely, the output unit 30 may be arranged on the second electrode 12 side and the diode D1 may be arranged on the first electrode 11 side.

The operation of the vibration-driven energy harvester 100 of the first embodiment is summarized as follows.

In the vibration-driven energy harvester of the first embodiment, the half-wave rectifier 40 includes the diode (first rectifying element) D1 and the DC-DC converter (output unit) 30, and the second electrode 12 is provided with an electret charged with negative charges 60 and the first electrode 11 is not provided with no electret. The diode D1 is disposed between the first electrode 11 and the second electrode 12 in an orientation in which the diode D1 is forward-biased by a current flowing from the first electrode 11 having no electret to the second electrode 12 having the electret charged with the negative charges 60. The diode D2 is disposed in an orientation in which the diode D2 is forward-biased by a current flowing from the second electrode 12 to the first electrode 11, and the diode D2 is arranged in parallel with the diode D1 between the first electrode 11 and the second electrode 12.

When the positive charges 62 of the first electrode 11 decrease and the positive charges 61 of the second electrode 12 increase (here, the charges have been induced by the negative charges 60 of the electret of the second electrode 12) in accordance with a change in the facing area between the first electrode 11 and the second electrode 12, a current I1 flows from the first electrode 11 to the second electrode 12 in a forward direction of the diode D1 to charge the capacitor C1, as shown in FIG. 2(b).

On the other hand, when the positive charges 62 of the first electrode 11 increase and the positive charges 61 of the second electrode 12 decrease (here, the charges have been induced by the negative charges 60 of the electret of the second electrode 12) in accordance with a change in the facing area between the first electrode 11 and the second electrode 12, a current I2 flows from the second electrode 12 to the first electrode 11 in a forward direction of the diode D2, as shown in FIG. 2(c). However, since the diode D2 is not connected to the output unit 30, the current I2 at this time does not contribute to an output, but rather positive charges move from the second electrode 12 to the first electrode 11. Therefore, the electric field E2d can be generated which is higher than the electric field E2 generated by a circuit configuration including only the diode D1 without the diode D2. Thus, the conversion efficiency of the vibration-driven energy harvester can be improved.

First Modification

Figure 4:
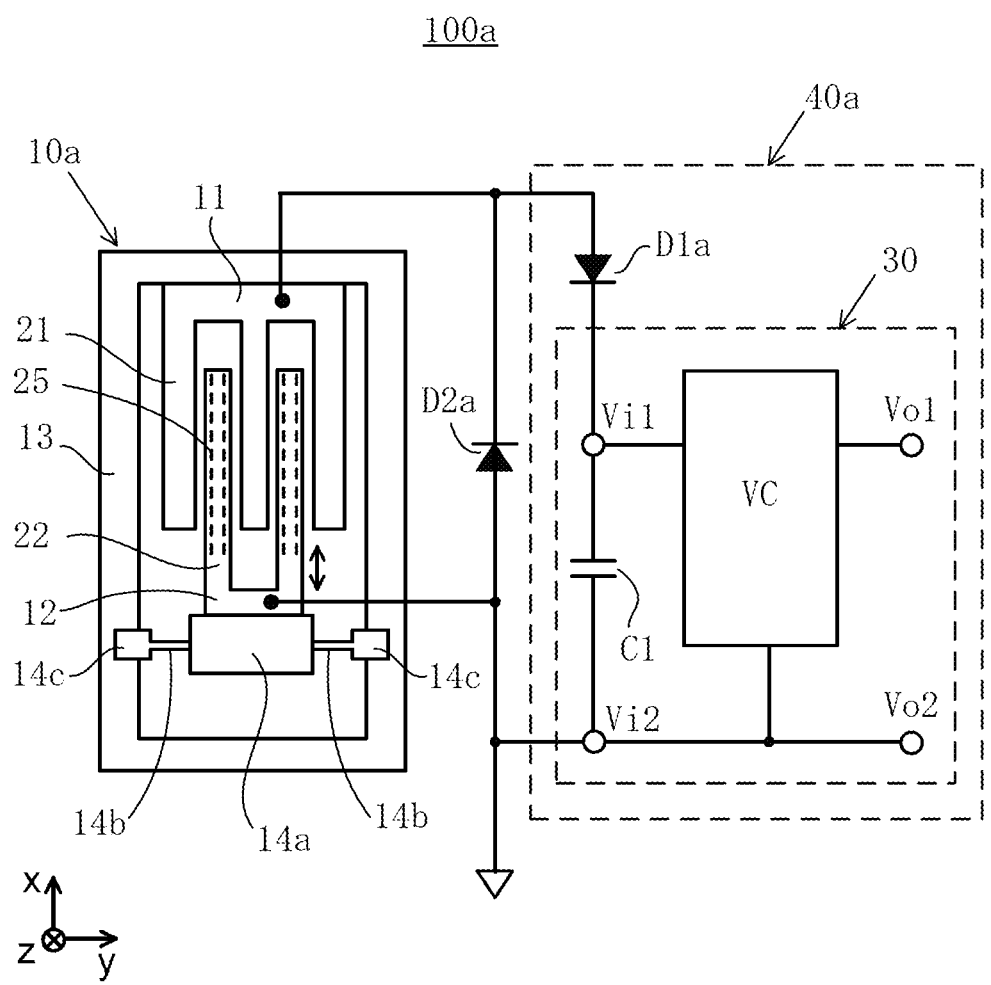
FIG. 4 is a schematic view showing a schematic configuration of a vibration-driven energy harvester 100a of a first modification.

A vibration-driven energy harvester 100a of a first modification will be described with reference to FIG. 4. Note that the same configurations as those in the first embodiment described above are designated by the same reference numerals and the description thereof will be omitted.

A vibration-driven energy harvesting element 10a included in the vibration-driven energy harvester 100a of the first modification is different from that in the first embodiment described above in that a first electrode 11 having no electret formed therein is a fixed electrode and a second electrode 12 having an electret with negative charges formed therein is a movable electrode.

The first electrode 11, which is a fixed electrode, is fixedly held by an insulating support frame 13.

On the other hand, the second electrode 12 is held by a holder 14 to vibrate with respect to the support frame 13 in the vertical direction (X direction) in the figure. In the comb portions 22 of the second electrode 12, surface regions 25 on sides facing the comb portions 21 of the first electrode 11 have electrets having negative charges.

In the first modification, an anode of a diode D1a which is a first rectifying element and a cathode of a diode D2a which is a second rectifying element are electrically connected to the first electrode 11. On the other hand, an anode of the diode D2a is electrically connected to the second electrode 12. One terminal Vi1 on an input side of an output unit 30 including a capacitor C1 and a voltage converter VC is electrically connected to a cathode of the diode D1a, and the other terminal Vi2 on the input side of the output unit 30 is electrically connected to the anode of the diode D2a and the second electrode 12.

Thus, in the same manner as in the first embodiment described above, for an alternating current power generated by the vibration-driven energy harvesting element 10, when the first electrode 11 has a negative potential and the second electrode 12 has a positive potential, the diode D2a is forward-biased so that a current flows through the diode D2a from the second electrode 12 to the first electrode 11. In this case, the diode D1a is reverse-biased so that no current flows to the output unit 30. On the other hand, when the first electrode 11 has a positive potential and the second electrode 12 has a negative potential, a current flows from the first electrode 11 to the second electrode 12 through the diode D1a and the output unit 30, and the diode D2a is forward-biased so that no current flows through the diode D2a.

The diode D1a and the output unit 30 constitute a half-wave rectifier 40a.

Thus, also in the first modification, in the same manner as in the first embodiment described above, the electric field between the first electrode 11 and the second electrode 12 can be prevented from being weakened in a vibrating state where the electretized second electrode 12 has a negative potential and the first electrode 11 has a positive potential. Thus, energy of environmental vibration can be converted into electric energy with an efficiency higher than that in a conventional vibration-driven energy harvester. In each of the first embodiment and the first modification described above, the electret with negative charges is formed in the surface of the second electrode 12 facing the first electrode 11. However, the configuration is not limited thereto. An electret with positive charges may be formed in the surface of the first electrode 11 facing the second electrode 12.

Also in this case, as described above, it is possible to prevent an electric power from being extracted from the vibration-driven energy harvesting element 10 in a state where the electric field E2 between the first electrode 11 and the second electrode 12 is weakened. Thus, the power generation efficiency can be improved.

Note that a positive electret may be formed in the first electrode 11 and a negative electret may be formed in the second electrode 12.

Effects of First Embodiment and First Modification (1) A vibration-driven energy harvester 100, 100a of the first embodiment and the first modification described above, comprises: a first electrode 11; a second electrode 12 that faces the first electrode 11; a holder 14 that holds at least one of the first electrode 11 and the second electrode 12 so that the first electrode 11 and the second electrode 12 move relative to each other; a half-wave rectifier 40 allows a current flowing from the first electrode 11 toward the second electrode 12 to flow into the output unit 30; and a diode (a second rectifying element) D2 allows a current flowing from the second electrode toward the first electrode to flow therethrough and blocks a current flowing from the first electrode 11 toward the second electrode 12, wherein: the first electrode 11 has a positively charged electret in a surface on a side facing the second electrode 12, or the second electrode 12 has a negatively charged electret in a surface on a side facing the first electrode 11.

With this configuration, a vibration-driven energy harvester that converts environmental vibration into electric energy with a high efficiency can be realized.

Second Embodiment

Figure 5:
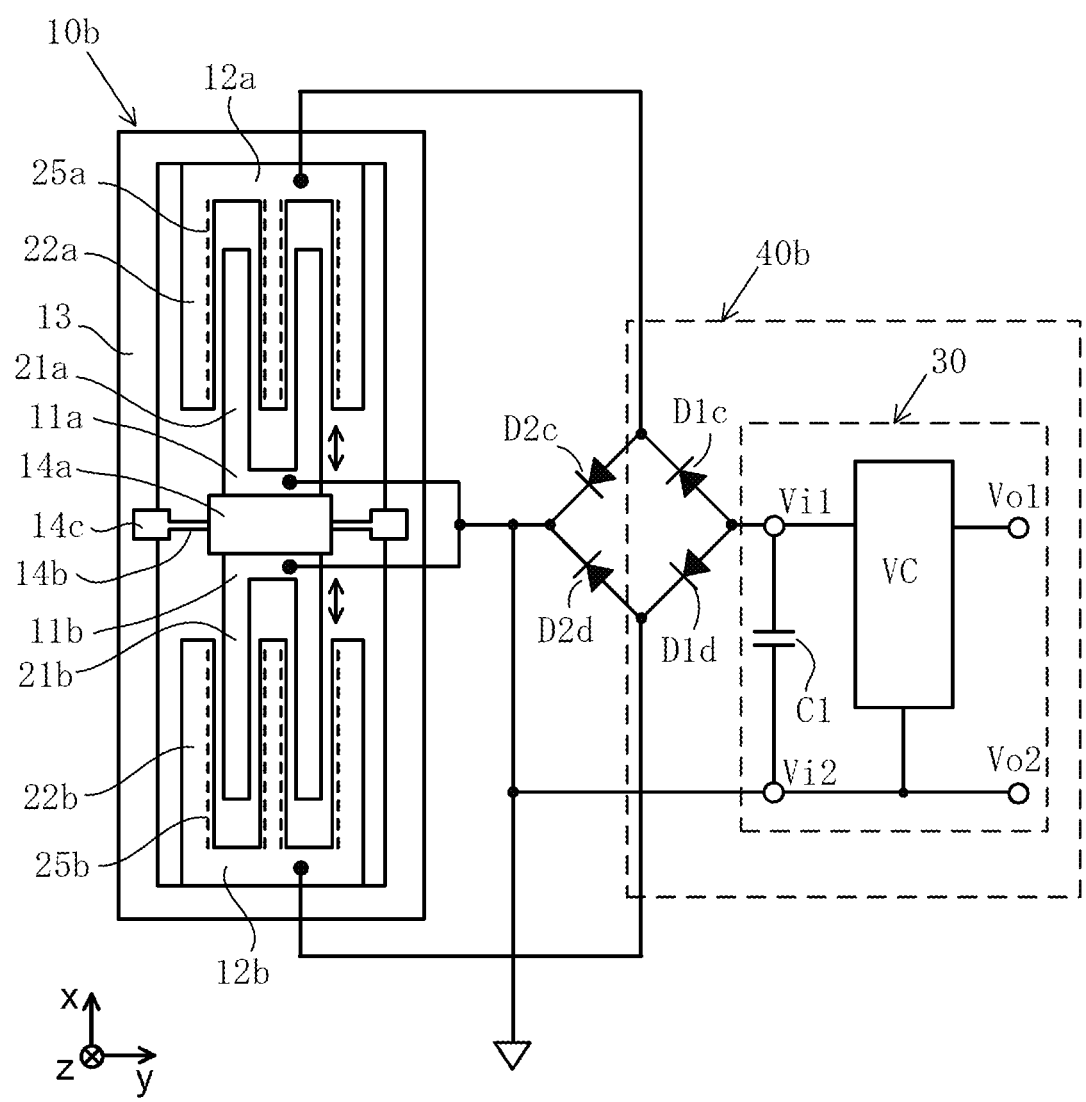
FIG. 5 is a schematic view showing a schematic configuration of a vibration-driven energy harvester 100b of a second embodiment according to the present invention.

FIG. 5 is a schematic view showing a schematic configuration of a vibration-driven energy harvester 100b of a second embodiment according to the present invention. Note that the same configurations as those in the first embodiment described above are designated by the same reference numerals and the description thereof will be omitted.

A vibration-driven energy harvesting element 10b included in the vibration-driven energy harvester 100b of the second embodiment is different from that in the first embodiment described above in that the vibration-driven energy harvesting element 10b has two pairs of an electrode having an electret formed therein and an electrode having no electret formed therein, and has two first rectifying elements and two second rectifying elements.

The second electrode 12a and the second electrode 12b, which are two fixed electrodes, are internally fixed on ends on the +X side and the −X side of the support frame 13, respectively. On the other hand, the first electrode 11a and the first electrode 11b, which are two movable electrodes, are provided on the +X side and the −X side of an electrode holding portion 14a that constitutes the holder 14, respectively. Therefore, in the same manner as in the above-described first embodiment, when the holder 14 vibrates due to vibration from outside, the first electrodes 11a, 11b vibrate in the X direction relative to the second electrodes 12a, 12b. In the respective comb portions 22a, 22b of the second electrodes 12a, 12b, surface regions 25a, 25b on sides facing the comb portions 21a, 21b of the first electrode 11a, 11b have electrets with negative charges formed therein.

In the vibration-driven energy harvesting element 10b, the support frame 13 can be interpreted as a first holder that integrally holds the two first electrodes 11a, 11b. The electrode holding portion 14a can be interpreted as a second holder that integrally holds the two second electrodes 12a, 12b. The connecting portions 14b can be interpreted as relative moving portions that allows the two first electrodes 11a, 11b and the two second electrodes 12a, 12b to be relatively movable.

Also in the second embodiment, in the same manner as in the first embodiment described above, diodes which are rectifying elements and an output unit 30 are connected to the electrodes in a predetermined relationship. A cathode of a diode D1c which is a first rectifying element and an anode of a diode D2c which is a second rectifying element are electrically connected to one electrode 12a of the second electrodes. A cathode of a diode D1d which is a first rectifying element and an anode of a diode D2d which is a second rectifying element are electrically connected to the other electrode 12b of the electrodes.

One terminal Vi1 on an input side of the output unit 30 including a capacitor C1 and a voltage converter VC is electrically connected to an anode of the diode D1c and an anode of the diode D1d.

The two first electrodes 11a, 11b are electrically connected. Further, cathodes of the diodes D2c and D2d which are second rectifying elements, and the other terminal Vi2 of the input side of the output unit 30 are electrically connected to the two first electrodes 11a, 11b. A potential of the two first electrodes 11a, 11b is a ground potential. Note that the first electrode 11a and the first electrode 11b are both held by the holder 14 and integrally vibrate in the X direction. Therefore, in each phase of vibration, a facing area between the first electrode 11b and the second electrode 12b decreases as a facing area between the first electrode 11a and the second electrode 12a increases. Therefore, phases of potentials of the first electrode 11a and the first electrode 11b are inverted to each other, with reference to a potential of the second electrode 12a and the second electrode 12b which is the common ground potential.

The configuration of the second embodiment can also be considered as a configuration in which two sets of the vibration-driven energy harvesting element 10, the diode D1 which is a first rectifying element, and the diode D2 which is a second rectifying element in the vibration-driven energy harvester 100 of the first embodiment described above are arranged in parallel. In this parallel arrangement, only one holder 14 and one output unit 30 are arranged and are common parts for the two parallel configurations. Therefore, also in the second embodiment, in the same manner as in the first embodiment described above, the rectifying characteristics of the diodes D1c, D1d and the diodes D2c, D2d can prevent the electric field between the first electrode 11 and the second electrode 12 from being weakened in a vibrating state where the electretized second electrode 12 has a negative potential and the first electrode 11 has a positive potential. Thus, energy of environmental vibration can be converted into electric energy with an efficiency higher than that in a conventional vibration-driven energy harvester. Furthermore, since the vibration-driven energy harvesting element 10b of the second modification has a configuration in which two vibration-driven energy harvesting elements are arranged in parallel, energy of environmental vibration can be converted into electrical energy with a further higher efficiency.

The diode D1c and the output unit 30, as well as the diode D1d and the output unit 30 constitute a half-wave rectifier 40b.

Note that in the above description, the first electrodes 11a, 11b are composed of two separate electrodes. However, the first electrodes 11a, 11b may be formed as one integrated electrode. That is, the first electrodes 11a, 11b in FIG. 5 may be one continuous electrode, and the holder 14 may hold the integrated first electrode from the upper surface or the periphery thereof. In such a case, a process of forming the first electrodes 11a, 11b is advantageously simplified.

Second Modification

Figure 6:
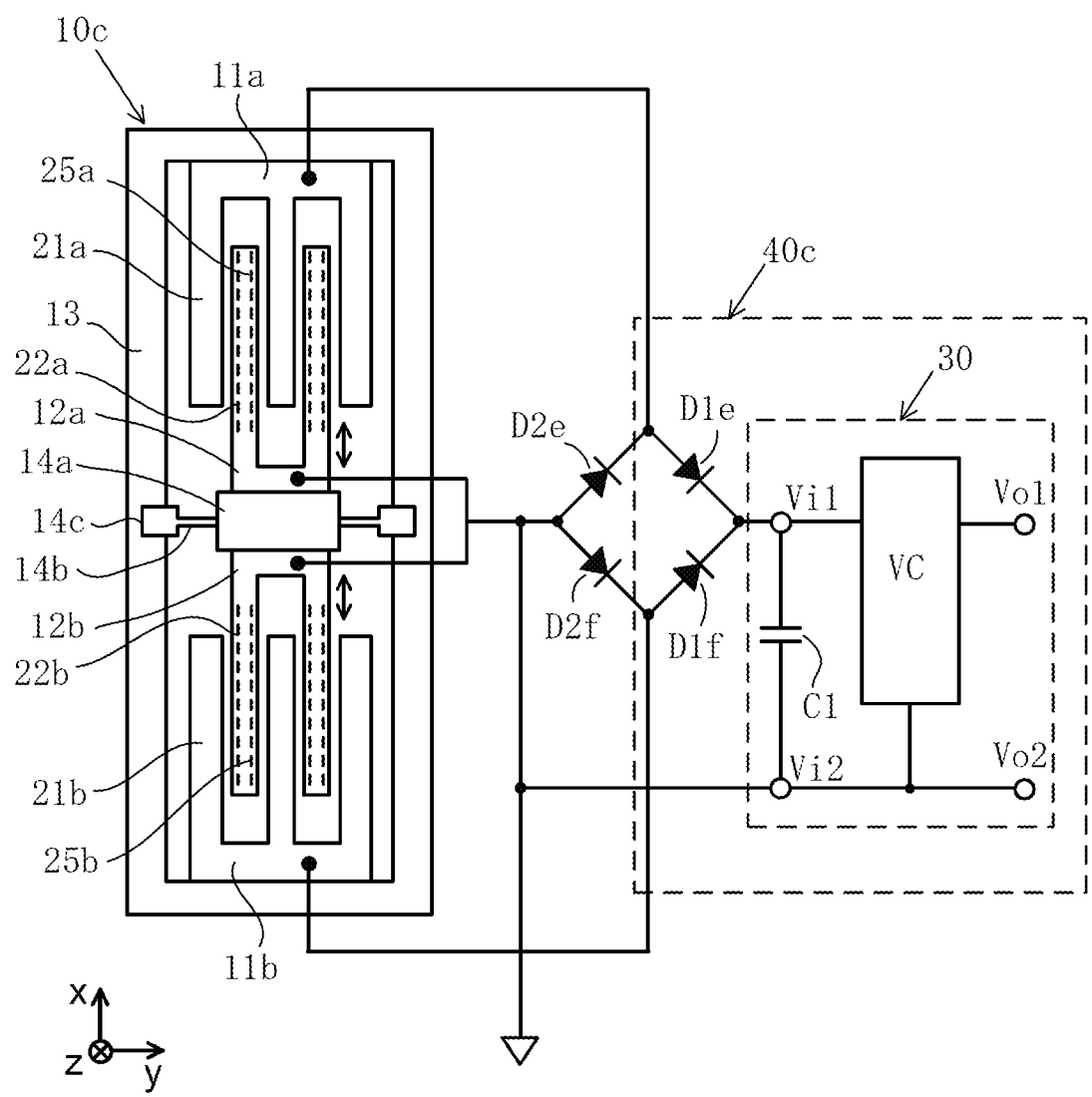
FIG. 6 is a schematic view showing a schematic configuration of a vibration-driven energy harvester 100c of a second modification.

A vibration-driven energy harvester 100c of a second modification will be described with reference to FIG. 6. Note that the same configurations as those in the first embodiment, the second embodiment, or the first modification described above are designated by the same reference numerals and the description thereof will be omitted.

The vibration-driven energy harvester 100c of the second modification has substantially the same configuration as that of the vibration-driven energy harvesting element 10b of the second embodiment described above. However, the vibration-driven energy harvester 100c differs from the vibration-driven energy harvesting element 10b of the second embodiment in that second electrodes 12a, 12b having electrets with negative charges formed therein are movable electrodes, cathodes and anodes of diodes D1e, D1f, D2e, D2f are reversed.

The first electrode 11a and the first electrode 11b, which are two fixed electrodes, are internally fixed on ends on the +X side and the −X side of the support frame 13, respectively. On the other hand, the second electrode 12a and the second electrode 12b, which are two movable electrodes, are provided on the +X side and the −X side of the electrode holding portion 14a that constitutes the holder 14, respectively. Therefore, in the same manner as in the above-described second embodiment, when the holder 14 vibrates due to vibration from outside, the first electrodes 11a, 11b vibrate in the X direction relative to the second electrodes 12a, 12b. In the respective comb portions 22a, 22b of the second electrodes 12a, 12b, surface regions 25a, 25b on sides facing the comb portions 21a, 21b of the first electrode 11a, 11b have electrets with negative charges formed therein.

Also in the second modification, in the same manner as in the second embodiment described above, diodes which are rectifying elements and an output unit 30 are connected to the electrodes in a predetermined relationship. An anode of a diode D1e which is a first rectifying element and a cathode of a diode D2e which is a second rectifying element are electrically connected to one electrode 11a of the first electrodes. An anode of a diode D1f which is a first rectifying element and a cathode of a diode D2f which is a second rectifying element are electrically connected to the other electrode 11b of the first electrodes.

One terminal Vi1 on an input side of an output unit 30 including a capacitor C1 and a voltage converter VC is electrically connected to cathodes of the diode D1e and the diode D1f.

The two second electrodes 12a, 12b are electrically connected. The anodes of the diodes D2e and D2f which are the second rectifying elements, and the other terminal Vi2 on the input side of the output unit 30 are electrically connected to the two second electrodes 12a, 12b. A potential of the two second electrode 12a, 12b is a ground potential.

Also in the second modification, phases of potentials of the second electrode 12a and the second electrode 12b are inverted to each other, with reference to a potential of the first electrode 11a and the first electrode 11b which is the common ground potential.

The configuration of the second modification can also be considered as a configuration in which two sets of the vibration-driven energy harvesting element 10a, the diode D1a which is a first rectifying element, and the diode D2a which is a second rectifying element in the vibration-driven energy harvester 100 of the first embodiment described above are arranged in parallel. In this parallel arrangement, only one holder 14 and one output unit 30 are arranged and are common parts for the two parallel configurations.

Therefore, also in the second modification, in the same manner as in the first embodiment and the first modification described above, the rectifying characteristics of the diodes D1e, D1f and the diodes D2e, D2f can prevent the electric field between the first electrode 11 and the second electrode 12 from being weakened in a vibrating state where the electretized second electrode 12 has a negative potential and the first electrode 11 has a positive potential. Thus, energy of environmental vibration can be converted into electric energy with an efficiency higher than that in a conventional vibration-driven energy harvester.

Furthermore, since the vibration-driven energy harvesting element 10b of the second modification has a configuration in which two vibration-driven energy harvesting elements are arranged in parallel, energy of environmental vibration can be converted into electrical energy with a further higher efficiency.

The diode D1e and the output unit 30, as well as the diode D1f and the output unit 30 respectively constitute a half-wave rectifier 40c.

Note that the second electrodes 12a, 12b may be formed as one integrated electrode, in the same manner as in the second embodiment described above. In this case, the holder 14 may hold the integrated second electrode from the upper surface or the periphery thereof. In this case, a process of forming the second electrodes 12a, 12b is advantageously simplified.

In the above description, the two first electrodes 11a, 11b are integrally held by one electrode holding portion 14a in the second embodiment and the two second electrodes 12a, 12b are integrally held by one electrode holding portion 14a in the second modification. However, the configuration is not limited thereto. That is, two holders 14 including their own electrode holding portions 14a may be provided apart from each other in the X direction, and each holder 14 may hold respective one of the two electrodes.

Note that the configuration in which two electrodes (the first electrodes 11a, 11b or the second electrodes 12a, 12b) are integrally held by one electrode holding portion 14a is excellent in that the vibration-driven energy harvesting elements 10b, 10c can be reduced in size.

In both of the second embodiment and the second modification described above, the electret with negative charges is formed in the surface of the second electrode 12 facing the first electrode 11. However, the present invention is not limited thereto. An electret with positive charges may be formed in the surface of the first electrode 11 facing the second electrode 12.

Also in this case, as described above, it is possible to prevent an electric power from being extracted from the vibration-driven energy harvesting element 10 in a state where the electric field E2 between the first electrode 11 and the second electrode 12 is weakened. Thus, the power generation efficiency can be improved.

Note that a positive electret may be formed in the first electrode 11 and a negative electret may be formed in the second electrode 12.

Effects of Second Embodiment and Second Modification (2) In addition to the configuration of the vibration-driven energy harvester 100 of the first embodiment, the vibration-driven energy harvesters 100b, 100c of the second embodiment and the second modification described above have two first electrodes 11a, 11b, two second electrodes 12a, 12b, two first rectifying elements (diodes) D1c, D1d, D1e, D1f, and two second rectifying elements (diodes) D2c, D2d, D2e, D2f.

Either one of the two first electrodes 11a, 11b or the two second electrodes 12a, 12b are electrically connected to each other and to one end of each of the two second rectifying elements D2c, D2d, D2e, D2f.

Further, the other of the two first electrodes 11a, 11b or the two second electrodes 12a, 12b are electrically connected the other end of each of the two second rectifying elements D2c, D2d, D2e, D2f and to one end of each of the two first rectifying elements D1c, D1d, D1e, D1f.

With this configuration, a vibration-driven energy harvester that converts environmental vibration into electric energy with a high efficiency can be realized.

(3) Additionally, in (2), the holder 14 includes: a first holding portion (support frame) 13 that integrally holds the two first electrodes 11a, 11b; a second holding portion (electrode holding portion) 14a that integrally holds the two second electrodes 12a, 12b; and a relative moving portion (a connecting portion) 14b that allows the two first electrodes 11a, 11b and the two second electrodes 12a, 12b to move relative to each other. In this case, the vibration-driven energy harvesting element 10b can be reduced in size.

In each of the embodiments and modifications described above, the region 25 forming the electret are not necessarily the entire surface of the second electrode 12 facing the first electrode 11, but may be a part thereof.

Further, the numbers of comb portions 21, 22 of the first electrode 11 and the second electrode 12 are not limited to the numbers described above. Any number of comb portions may be provided. Further, with respect to shape, the first electrode 11 and the second electrode 12 are not limited to the comb electrodes described above. They may be parallel plate electrodes arranged to face each other.

Further, a plurality of diodes connected in series to increase a breakdown voltage may be used as the diode D1 and the diode D2. Further, the first rectifying element and the second rectifying element are not limited to diodes, but may be other electric elements such as two-pole vacuum tubes or spintronics rectifying elements, which perform rectification by a spintronics rectifying action.

Although various embodiments and modifications have been described above, the present invention is not limited thereto. Additionally, the embodiments and the modifications may be applied alone or in combination. Other aspects that are conceivable within the scope of the technical idea of the present invention are also encompassed within the scope of the present invention.

The disclosure of the following priority application is herein incorporated by reference:

Japanese Patent Application No. 2018-90197 (filed May 8, 2018)

REFERENCE SIGNS LIST 100, 100a, 100b, 100c . . . vibration-driven energy harvester, 10, 10a, 10b, 10c . . . vibration-driven energy harvesting element, 11, 11a, 11b . . . first electrode, 12, 12a, 12b second electrode, 13 . . . support frame, 14 . . . holder, D1, D1a, D1c, D1d, D1e, D1f . . . first rectifying element (diode), D2, D2a, D2c, D2d, D2e, D2f . . . second rectifying element (diode), C1 . . . capacitor, VC . . . voltage conversion circuit, 30 . . . output unit, 40, 40a, 40b, 40c . . . half-wave rectifier

The invention claimed is:

1. A vibration-driven energy harvester, comprising:
a first electrode;
a second electrode that faces the first electrode;
a holder that holds at least one of the first electrode and the second electrode so that the first electrode and the second electrode move relative to each other;
a half-wave rectifier that includes a first rectifying element and an output unit and is electrically connected to the first electrode and the second electrode so that the half-wave rectifier allows a current flowing from the first electrode toward the second electrode to flow into the output unit and blocks a current flowing from the second electrode toward the first electrode; and
a second rectifying element that is electrically connected to the first electrode and the second electrode so that the second rectifying element allows a current flowing from the second electrode toward the first electrode to flow therethrough and blocks a current flowing from the first electrode toward the second electrode,
wherein
the first electrode has a positively charged electret in a surface on a side facing the second electrode, or the second electrode has a negatively charged electret in a surface on a side facing the first electrode,
the vibration-driven energy harvester includes two first electrodes, two second electrodes, two first rectifying elements, and two second rectifying elements,
either the two first electrodes or the two second electrodes are electrically connected to each other and to one end of each of the two second rectifying elements, and
the other of the two first electrodes or the two second electrodes, which is different from the one, are electrically connected to another end of each of the two second rectifying elements and to one end of each of the two first rectifying elements.

2. The vibration-driven energy harvester according to claim 1, wherein:

the holder includes:
a first holding portion that integrally holds the two first electrodes;
a second holding portion that integrally holds the two second electrodes; and
a relative moving portion that allows the two first electrodes and the two second electrodes to move relative to each other.

3. The vibration-driven energy harvester according to claim 2, wherein:
the output unit includes a capacitor and a voltage conversion circuit arranged in parallel with the capacitor.

4. The vibration-driven energy harvester according to claim 3, wherein:
at least one of the first rectifying element and the second rectifying element is a diode.

5. The vibration-driven energy harvester according to claim 1, wherein:
the output unit includes a capacitor and a voltage conversion circuit arranged in parallel with the capacitor.

6. The vibration-driven energy harvester according to claim 5, wherein:
at least one of the first rectifying element and the second rectifying element is a diode.

7. The vibration-driven energy harvester according to claim 1, wherein:
at least one of the first rectifying element and the second rectifying element is a diode.

8. A vibration-driven energy harvester, comprising:
a first electrode;
a second electrode that faces the first electrode;
a holder that holds at least one of the first electrode and the second electrode so that the first electrode and the second electrode move relative to each other;
a half-wave rectifier that includes a first rectifying element and an output unit and is electrically connected to the first electrode and the second electrode so that the half-wave rectifier allows a current flowing from the first electrode toward the second electrode to flow into the output unit and blocks a current flowing from the second electrode toward the first electrode; and
a second rectifying element that is electrically connected to the first electrode and the second electrode so that the second rectifying element allows a current flowing from the second electrode toward the first electrode to flow therethrough and blocks a current flowing from the first electrode toward the second electrode,
wherein
the second electrode has a negatively charged electret in a surface on a side facing the first electrode,
the first rectifying element and the second rectifying element are diodes,
the second electrode is electrically connected to a cathode of a diode which is the first rectifying element and an anode of a diode which is the second rectifying element, and
the first electrode is electrically connected to a cathode of a diode which is the second rectifying element.

* * * * *